(12) United States Patent
Lin (10) Patent No.: US 9,203,386 B2
(45) Date of Patent: *Dec. 1, 2015

(54) ANALOG DELAY LINES AND ADAPTIVE BIASING

(71) Applicant: MICRON TECHNOLOGY, INC., Boise, ID (US)

(72) Inventor: Feng Lin, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/322,269

(22) Filed: Jul. 2, 2014

(65) Prior Publication Data

US 2014/0312952 A1    Oct. 23, 2014

Related U.S. Application Data

(60) Continuation of application No. 13/953,500, filed on Jul. 29, 2013, now Pat. No. 8,773,187, which is a continuation of application No. 13/612,454, filed on Sep. 12, 2012, now Pat. No. 8,508,285, which is a division of application No. 12/883,893, filed on Sep. 16, 2010, now Pat. No. 8,289,062.

(51) Int. Cl.
*H03H 11/26* (2006.01)
*H03K 5/13* (2014.01)

(52) U.S. Cl.
CPC ............ *H03K 5/133* (2013.01); *H03H 11/26* (2013.01); *H03H 11/265* (2013.01); *H03K 5/131* (2013.01)

(58) Field of Classification Search
USPC .................... 327/149, 158, 285, 287, 278
See application file for complete search history.

(56) References Cited

U.S. PATENT DOCUMENTS

| | | | |
|---|---|---|---|
| 5,563,546 A | 10/1996 | Tsukada | |
| 5,898,328 A * | 4/1999 | Shoji | 327/157 |
| 6,518,807 B1 | 2/2003 | Cho | |
| 6,744,305 B2 | 6/2004 | Oikawa et al. | |
| 6,836,170 B2 | 12/2004 | Kitagawa et al. | |
| 6,847,242 B2 | 1/2005 | Chung | |
| 6,870,415 B2 | 3/2005 | Zhang et al. | |
| 7,196,567 B2 | 3/2007 | Nguyen | |
| 7,205,803 B2 | 4/2007 | Chung et al. | |
| 7,236,409 B2 | 6/2007 | Isobe | |
| 7,251,305 B2 | 7/2007 | Gauthier et al. | |
| 7,411,422 B2 | 8/2008 | Clements et al. | |
| 7,598,788 B2 | 10/2009 | Cao | |
| 8,289,062 B2 | 10/2012 | Lin | |
| 8,664,994 B1 * | 3/2014 | Amrutur et al. | 327/261 |
| 2006/0067396 A1 | 3/2006 | Christensen | |
| 2006/0238237 A1 | 10/2006 | Clements et al. | |
| 2007/0057708 A1 | 3/2007 | Uehara et al. | |
| 2008/0186618 A1 | 8/2008 | Wong | |
| 2009/0224806 A1 | 9/2009 | Huang et al. | |
| 2010/0134161 A1 | 6/2010 | Xu et al. | |
| 2012/0068753 A1 | 3/2012 | Lin | |
| 2013/0002344 A1 | 1/2013 | Lin | |
| 2013/0314140 A1 | 11/2013 | Lin | |

* cited by examiner

*Primary Examiner* — An Luu
(74) *Attorney, Agent, or Firm* — Dorsey & Whitney LLP (57) ABSTRACT

Examples of analog delay lines and analog delay systems, such as DLLs incorporating analog delay lines are described, as are circuits and methods for adaptive biasing. Embodiments of adaptive biasing are described and may generate a bias signal for an analog delay line during start-up. The bias signal may be based in part on the frequency of operation of the analog delay line.

20 Claims, 8 Drawing Sheets

ANALOG DELAY LINES AND ADAPTIVE BIASING

CROSS REFERENCE TO RELATED APPLICATION(S)

This application is a continuation of pending U.S. patent application Ser. No. 13/953,500, filed Jul. 29, 2013, which is a continuation of U.S. patent application Ser. No. 13/612,454, filed Sep. 12, 2012, and issued as U.S. Pat. No. 8,508,285 on Aug. 13, 2013, which application is a divisional of U.S. patent application Ser. No. 12/883,893, filed Sep. 16, 2010, and issued as U.S. Pat. No. 8,289,062 on Oct. 16, 2012. These applications and patents are incorporated herein by reference, in their entirety, for any purpose.

TECHNICAL FIELD

Embodiments of the invention relate generally to semiconductor devices and, some examples particularly to analog delay lines.

BACKGROUND

In many electronic devices, for example memory devices, components may be clocked by an external clock signal and may perform operations at predetermined times relative to the rising and falling edges of the applied clock signal. Examples of synchronous integrated circuits include synchronous memory devices such as synchronous dynamic random access memories ("SDRAMs"), synchronous static random access memories ("SSRAMs"), and packetized memories like SLDRAMs and RDRAMs, and include other types of integrated circuits as well, such as microprocessors. The timing of signals external to a synchronous integrated circuit may be determined by an external clock signal, and operations within the synchronous integrated circuit may be synchronized to external operations. For example, commands may be placed on a command bus of a memory device in synchronism with an external clock signal, and the memory device may latch these commands at the proper times to successfully capture the commands. To latch the applied commands, an internal clock signal may be developed in response to the external clock signal, and is typically applied to latches contained in the memory device to clock the commands into the latches. The internal clock signal and external clock should be synchronized to ensure the internal clock signal clocks the latches at the proper times to successfully capture the commands. In the present description, "external" may refer to signals and operations outside of the memory device, and "internal" may refer to signals and operations within the memory device. Moreover, although the present description includes description of synchronous memory devices, the principles described herein are equally applicable to other types of synchronous integrated circuits or to the synchronization of generally any periodic signals.

To synchronize external and internal clock signals in modern synchronous memory devices, a number of different approaches have been considered and utilized, including delay locked loops ("DLLs"), as will be appreciated by those skilled in the art. Generally, these approaches utilize a delay line containing one or more delay elements to delay an input periodic signal and feed back a phase difference-related signal between the input and the output to control the amount of delay provided by the delay line. In this manner the output periodic signal may be "locked" to the input periodic signal.

Figure 1:
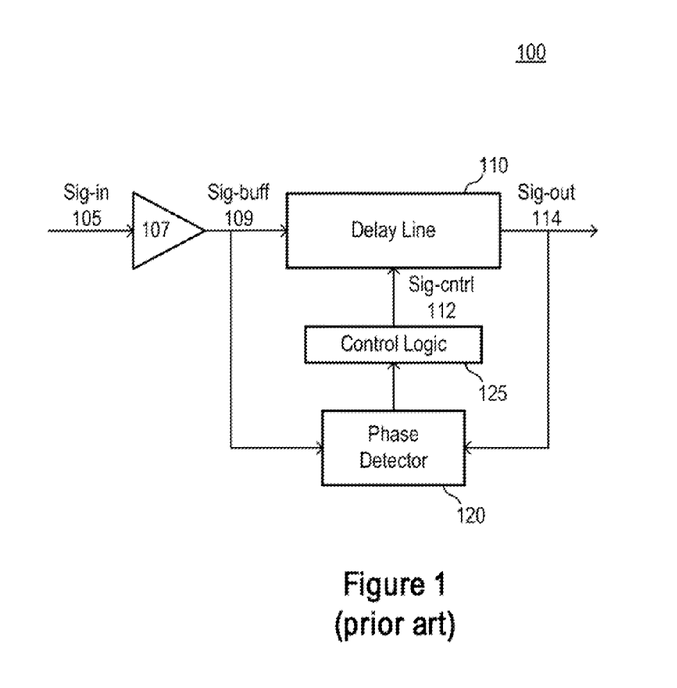
FIG. 1 is a schematic illustration of a general delay locked loop.

FIG. 1 is a schematic illustration of a general delay locked loop 100. An input signal 105, Sig_in, may be provided to a buffer 107 which may generate the buffered signal Sig_buff 109. The buffered signal may be provided to a delay line 110 that is configured to delay the buffered signal in accordance with a control signal sig_cntrl 112 to generate an output signal, sig_out 114. To generate the control signal 112, a phase detector 120 and control logic 125 may be provided. The phase detector 120 may compare a phase of the output signal sig_out 114 with that of the buffered input signal sig_buff 109. The phase detector 120 may generate a signal corresponding to a phase difference between sig_buff 109 and sig_out 114. The signal corresponding to the phase difference ma be provided to the control logic 125, which may include, for example, a charge pump and/or a loop filter, which may in turn generate the control signal sig_contrl 112. Although not shown in FIG. 1, additional components such as multiple delay lines (for example, a coarse and fine delay line), or mock delays in the feedback path may also be included.

As speeds of electronic devices continue to increase, timing requirements for DLLs such as those shown in FIG. 1 are increasing. Jitter and/or skew may be caused by variations in the power supply voltage(s) which power the elements in the delay line 110. Voltage regulators may be used in an effort to maintain a constant power supply voltage and reduce or eliminate jitter or skew caused by power supply voltage variations.

Power supply voltages, however, are also decreasing in many electronic devices. It may be infeasible to continue to use voltage regulators to maintain constant power supply voltages at lower voltages.

Generally, the delay line 110, phase detector 120, and control logic 125 may be implemented using digital circuitry. For example, the delay line 110 may include multiple individual delay elements (e.g. stages) coupled in series, with each individual delay element delaying the input signal an amount and providing the delayed input signal to the next element, until the output signal sig_out 114 is generated. Each delay element is typically implemented using two NAND gates. The control logic 125 is typically configured to provide a digital signal to the delay line 110. That is, the sig_cntrl 112 is typically a digital signal.

Analog delay elements have been considered for use in the delay line 110; however, analog delay elements typically consume a larger area and more power than their digital counterparts.

DETAILED DESCRIPTION

Certain details are set forth below to provide a sufficient understanding of embodiments of the invention. However, it will be cleat to one skilled in the art that embodiments of the invention may be practiced without various of these particular details. In some instances, well-known circuits, control signals, timing protocols, and/or software operations have not been shown in detail in order to avoid unnecessarily obscuring the described embodiments of the invention. For example, embodiments described below include description of differential circuits and systems. It is to be understood that single-ended circuits and systems may be used in other embodiments.

As described generally above, variations in power supply voltage(s) may introduce undesirable jitter and/or skew into the operation of DLLs. Analog delay elements may exhibit improved power supply sensitivity; however, they have conventionally been considered to consume an unacceptable amount of power and/or area. Embodiments of the present invention provide delay lines having analog delay elements. Delay elements and systems are described which may reduce the amount of area and/or power consumed by a DLL using embodiments of the described delay lines. Further, embodiments of adaptive biasing techniques and circuitry are described which may advantageously improve the lock range of an analog delay line, and/or the area required for an analog delay line. The description of advantages provided herein is to aid in understanding embodiments of the invention, and it is to be understood that not all embodiments may provide all described advantages, and some embodiments may not provide any of the described advantages.

Figure 2:
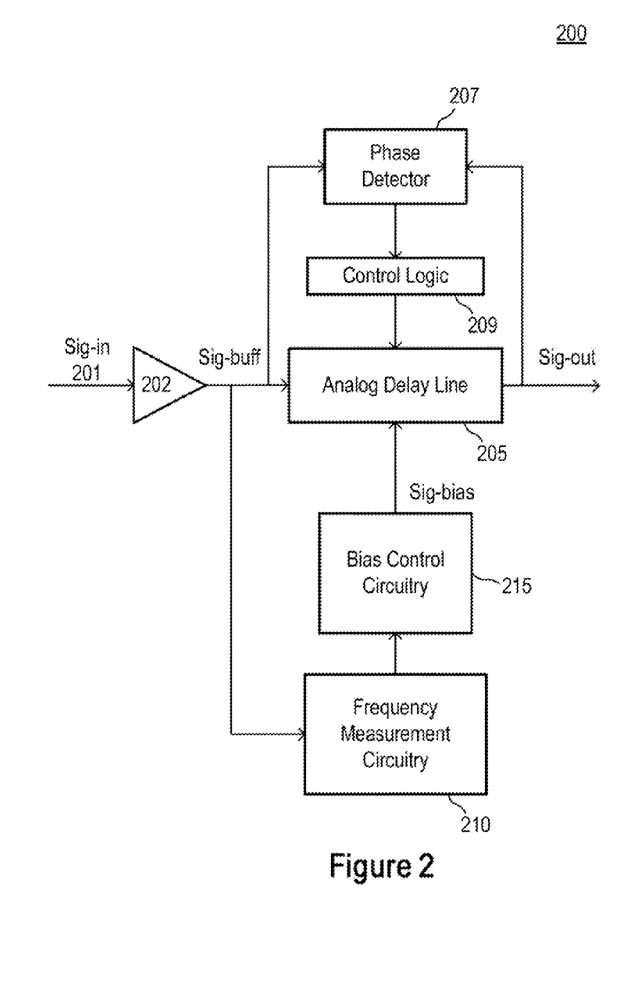
FIG. 2 is a schematic illustration of a DLL including an analog delay line in accordance with an embodiment of the present invention.

FIG. 2 is a schematic illustration of a DLL 200 including an analog delay line in accordance with an embodiment of the present invention. The DLL 200 may include an analog delay line 205. A buffer 202 may be coupled to the analog delay line 205. A phase detector 207 may be coupled to an input and an output of the analog delay line 205. Control logic 209 may be coupled to the Phase Detector 207 and the analog delay line 205. Further, frequency measurement circuitry 210 may be coupled to the analog delay line 205. Bias control circuitry 215 may be coupled to the frequency measurement circuitry 210 and the analog delay line 205.

The analog delay line 205 may include a plurality of analog delay elements coupled in series, examples of which will be described further below. Portions of the analog delay elements may share bias circuits, as will be described further below. Sharing bias circuits may advantageously reduce area and/or power required to implement the analog delay line 205 in some embodiments. Analog delay elements in the analog delay line 205 may be adaptively biased, as will be described further below. Adaptive biasing may also advantageously improve locking range, reduce area and/or reduce power required to implement the analog delay line 205.

The phase detector 207 and control logic 209 may generally be implemented using any circuitry suitable for adjusting a delay of the analog delay line 205 based on a comparison of the input and output signals. In embodiments of the present invention, the phase detector 207 and control logic 209 may be implemented using digital circuitry of conventional DLLs. That is, in some embodiments, the analog delay line 205, while using analog delay elements instead of digital delay elements, may nonetheless be configured to receive a conventional digital control signal, as will be described further below.

The frequency measurement circuitry 210, as will be described further below, is configured to measure a frequency of operation of the analog delay line 205, for example, the frequency of the buffered signal sig_buff or one of the input signals to one of the intermediate delay elements in the delay line. The frequency measurement circuitry 210 may provide an indication of the frequency of operation to the bias control circuitry 215 (e.g. a control signal). Examples will be described further below; however, substantially any circuitry suitable for measuring a frequency of operation of the analog delay line 205 may be used.

The bias control circuitry 215, as will be described further below, is configured to generate a bias voltage and/or current for the analog delay line 205. The bias control circuitry 215 may receive the indication of frequency of operation from the frequency measurement circuitry 210, and in this manner, the bias voltage and/or current may be based on the frequency of operation.

During operation, an input signal 201, sig_in, may be provided to the buffer 202. Generally, any periodic signal may be provided as the input signal 201, including a clock signal. The buffer may generate a buffered input signal sig_buff. The analog delay line 205 may delay the buffered input signal through a series of analog delay elements to generate an output signal sig_out. The phase detector 207 may receive the output signal sig_out and the buffered input signal sig_buff. The phase detector 207 may generate a signal indicative of a phase difference between the output signal and the buffered input signal, and provide the signal to the control logic 209. The control logic 209 may generate a control signal setting a delay time for one or more elements of the analog delay line 205 and/or selecting a number of delay elements for use in the analog delay line 205. That is, the control logic 209 may specify an output location from the analog delay line 205, selecting a number of delay elements through which the buffered input signal is propagated to generate the output signal.

A bias voltage and/or current may be provided to the analog delay line 205 by the bias control circuitry 215. The frequency measurement circuitry may be coupled to the analog delay line 205 to measure a frequency of the periodic signal passed through the analog delay line 205. The frequency measurement circuitry 210 may provide a signal to the bias control circuitry 215 indicative of the frequency of operation of the analog delay line 205. Based on the frequency of operation, and in some examples, with a comparison of a control voltage or current with a reference, the bias control circuitry 215 may generate a bias signal for the analog delay line 205, which may in turn be used to generate a bias voltage or current used by one or more of the delay elements. The bias voltage and/or current may be established in this manner during a startup mode of operation of the DLL 200. Accordingly, the bias voltage and/or current may be established once, and the DLL operated using the established voltage and/or current. In other embodiments, the bias voltage and/or current may be periodically updated.

Figure 3:
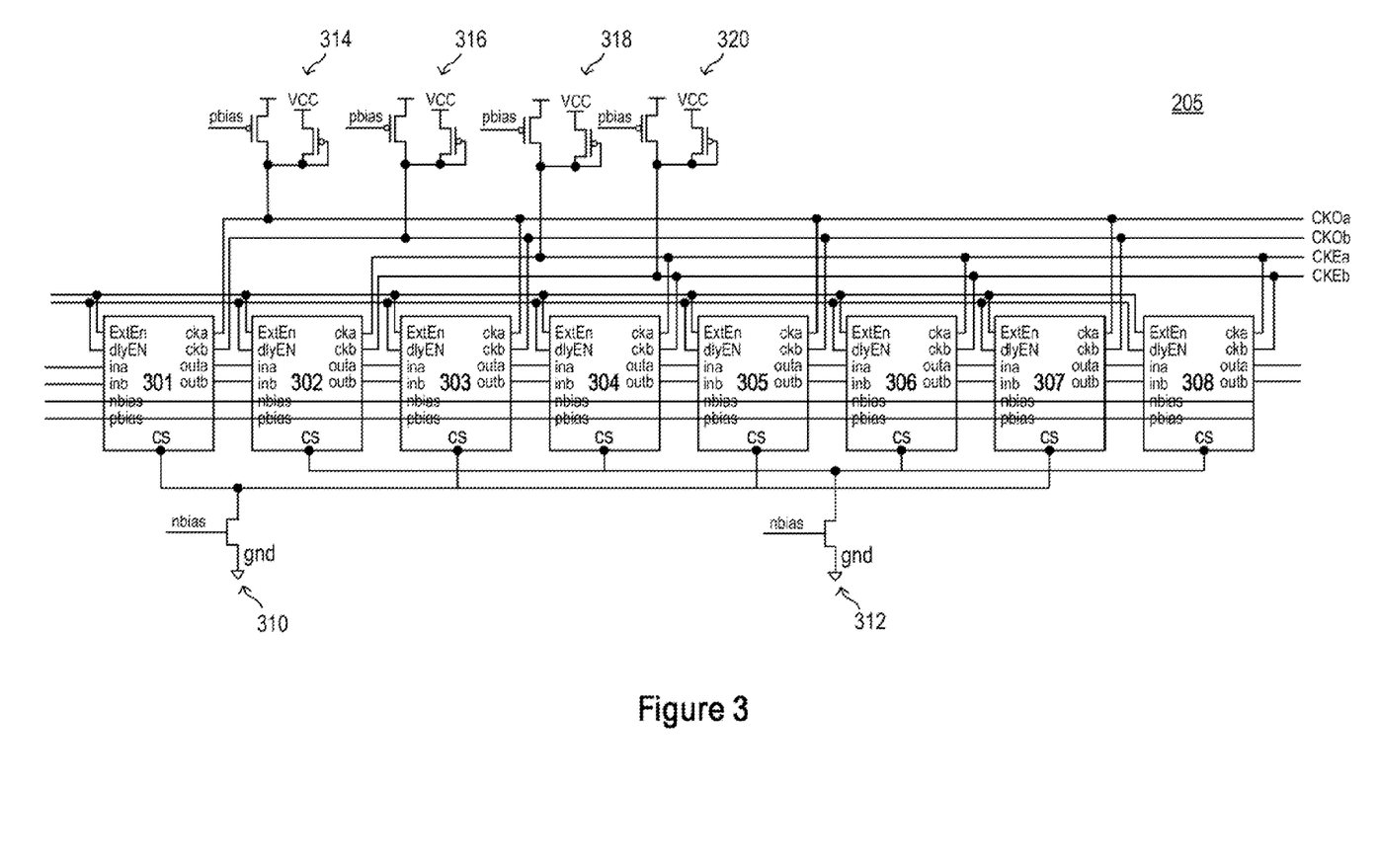
FIG. 3 is a schematic illustration of an analog delay line in accordance with an embodiment of the present invention.

FIG. 3 is a schematic illustration of analog delay line 205 in accordance with an embodiment of the present invention. The analog delay line 205 includes analog delay elements 301-308 coupled in series. As will be described further below, each of the analog delay elements 301-308 includes an ExitEn input to receive an ExitEN signal, which may be provided by the control logic 209 of FIG. 2. The ExitEn signal may specify which of the delay elements the output signal is taken from. Each of the analog delay elements 301-309 further includes a dlyEN input to receive a dlyEn signal, which may also be provided by the control logic 209 of FIG. 2. The dlyEn signal may specify which of the analog delay elements 301-308 should be enabled to delay an input signal.

Each of the analog delay elements 301-309 further includes an ina and inb input, configured to receive a differential input signal, such as a differential version of the signal sig_buff of FIG. 2. Each of the analog delay elements 301-309 further includes an nbias and pbias input configured to receive bias signals for NMOS and PMOS transistors, respectively. The nbias and pbias signals may be provided by the bias control circuitry 215 of FIG. 2 in some embodiments.

Each of the analog delay elements 301-309 includes the outa and outb outputs for providing a delayed version of the ina and inb signals to the ina and inb inputs of the next delay element. Each of the analog delay elements 301-309 also includes a cka and ckb output for providing the delayed version of the respective ina and inb inputs to an output line of the analog delay line 205 the lines ckOa and ckOb, or ckEa and ckEb, based on (e.g. responsive to) the ExitEN signal. The analog delay line 20 of FIG. 3 is of a type where both an even and an odd output signal may be provided, which may later be mixed to improve a resolution of the delay line. Accordingly, the delay elements 301, 303, 305, and 307 have their outputs cka and ckb coupled to the odd output line ckOa and ckOb, respectively. The delay elements 302, 304, 306, and 308 have their outputs cka and ckb coupled to the even output line ckEa and ckEb, respectively. In this manner, an odd and even signal may be output from the analog delay line that are separated by a single unit delay amount. These signals may be mixed, as known in the art, to achieve improved resolution of a DLL incorporating the delay line 205.

Some components of the analog delay elements 301-308 may share load and/or bias circuits. The sharing of load and/or bias circuitry may reduce the area required for the delay line 205. For example, the odd delay elements 301, 303, 305 and 307, may share a bias circuit 310. The bias circuit 310 is implemented as an NMOS transistor that receives the tibias signal at its gate terminal. The bias circuit 310 will accordingly provide a current based on the nbias signal and transistor characteristics of the transistor. In an analogous manner, the even delay elements 302, 304, 305, and 308 may share a bias circuit 312, again implemented as an NMOS transistor that receives the nbias signal at its gate terminal.

The cka outputs of the odd delay elements 301, 303, 305, and 307, may be coupled to the load circuit 314. The load circuit 314 may be implemented as a pair of PMOS transistors, with one configured to receive the pbias signal at its gate terminal, and the other having its gate terminal tied to its drain, which is tied to the drain of the first transistor, as shown. The load circuit 314 may accordingly provide a load to the analog delay elements based on the pbias signal and transistor characteristics. In a similar manner, the ckb outputs of the odd delay elements 301, 303, 305, and 307 are coupled to the load circuit 316, again implemented as a pair of pmos transistors. The cka outputs of the even delay elements 302, 304, 306, and 308, are coupled to the load circuit 318. The ckb outputs of the even delay elements 302, 304, 306, and 308, are coupled to the load circuit 320. Sharing load and/or bias circuits among the delay elements may reduce an area required to layout the analog delay line 205. In other embodiments, load and/or bias circuits may not be shared.

Figure 4:
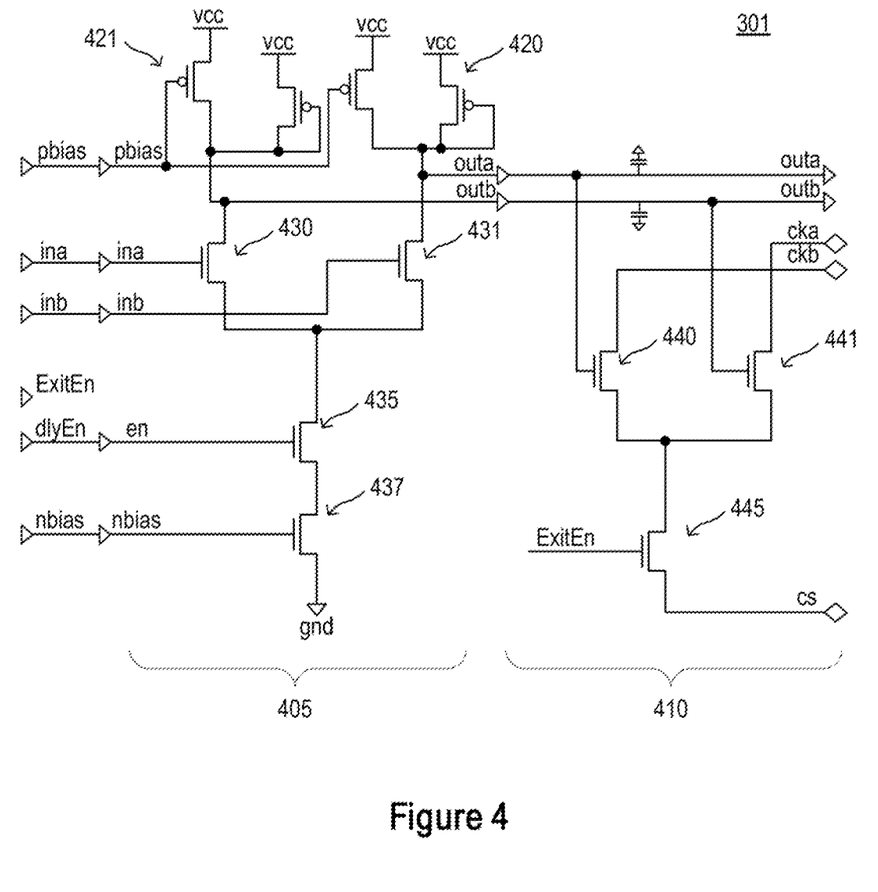
FIG. 4 is a schematic illustration of an analog delay element arranged in accordance with an embodiment of the present invention.

FIG. 4 is a schematic illustration of an analog delay element 301 arranged in accordance with an embodiment of the present invention. The analog delay element 301 includes a delay amplifier 405 and a multiplexer 410. The delay amplifier 405 is configured to delay a differential input signal ina and inb to generate the delayed output signal outa and outb, responsive to the dlyEn signal. The multiplexer 410 is configured to couple the outa and outb signals to the cka and ckb outputs responsive to the ExitEn signal. Recall that the cka and ckb outputs may be provided to the even and odd output lines, ckOa, ckOb, and ckEa, ckEb.

The delay amplifier 405 includes loads 420 and 421, one load for each leg of the differential delay amplifier 405. The loads 420 and 421 are implemented as a pair of pmos transistors, with one transistor of the pair receiving the pbias signal at its gate, and the other transistor having its gate coupled to its drain. The loads 420 and 421 are coupled to differential amplifier transistors 430 and 431, respectively. The transistors 430 and 431 receive the ina and inb signals at their gates, respectively, and generate the outa and outb signals at their drains, respectively. Both differential amplifier transistors 430 and 431 are coupled to the transistor 435. The transistor 435 is configured to receive the dlyEn signal at its gate, and therefore to turn on responsive to the dlyEn signal. Accordingly, the amplifier 405 is enabled responsive to the dlyEn signal turning the transistor 435 on. The bias transistor 437 is coupled to the enable transistor 435 and is configured to receive the tibias signal at its gate. The bias transistor 437 accordingly provides a bias current to the amplifier 405 based on the nbias signal and the characteristics of the transistor 437. The delay provided by the amplifier 405 will in part be based on (e.g. determined by) the bias current, and therefore the nbias voltage. The delay provided by the amplifier 405 may also be in part determined by the load 420, and therefore by the pbias voltage. As will be described further below, the nbias and pbias signals may be adaptively determined to account for process variations and frequency of operation of the delay line. Although the amplifier 405 is implemented using amplifier transistors 430 and 431, substantially any analog delay element configuration may be used.

The multiplexer 410 is configured to provide the outa and outb signals to the cka and ckb outputs responsive to the ExitEn signal. By enabling the multiplexer at a particular delay element, the number of delay elements used in the analog delay line 205 of FIG. 2 may be selected. The multiplexer 410 includes two multiplexer transistors 440 and 441 configured to receive the outa and outb signals at their respective gate terminals and output cka and ckb signals at their respective drain terminals. The transistors 440 and 441 may be loaded by shared loads 314 and 316 of FIG. 3. For example, as shown in FIG. 3, the load 314 may be coupled to the cka output, while the load 316 may be coupled to the ckb output. Note that the cka and ckb outputs are also illustrated in FIG. 4 and connect to the transistors 441 and 440, respectively. The transistors 440 and 441 are coupled to an enable transistor 445 configured to receive the ExitEn signal at its gate. Accordingly the enable transistor 445 turns on responsive to the ExitEn signal and enables the cka and ckb signals to be output from the multiplexer 410. The multiplexer 410 may be biased at the CS input by shared bias circuit 310 of FIG. 3. Note that the bias circuit 310 is shown in FIG. 3 coupled to the CS node of the element 301. In FIG. 4, the CS node is shown coupled to the transistor 445.

Each of the delay elements 301-308 of FIG. 3 may include an amplifier and multiplexer analogous to those shown in FIG. 4. The delay amplifiers and multiplexers may share load and bias circuitry as described with reference to FIGS. 3 and 4. Also note that each delay element 301-308 may include only a single delay amplifier, such as the amplifier 405 of FIG. 4. Although in other embodiments, more amplifiers may be used in each delay element, in some embodiments only one amplifier is present. This may be in contrast to previous digital designs, where at least two NAND gates were used in each delay element. Utilizing a single amplifier and multiplexer per delay element may reduce the area and power required to implement an analog delay line in accordance with embodiments of the present invention.

Accordingly, embodiments of analog delay lines and analog delay elements that may be used for example, in DLLs for electronic devices, have been described above. Analog delay fines incorporating analog delay elements as opposed to digital delay elements, may have improved power supply sensitivity (PSS) and may advantageously not require power supply regulation, even as power supply voltages decrease in electronic devices. Embodiments of analog delay lines and elements described above may utilize a single amplifier per element, and may share load and/or bias circuitry, which may advantageously reduce the power supply consumption and area required to implement analog delay lines in accordance with the present invention.

One drawback of analog delay lines may be a reduced lock range of a DLL incorporating the analog delay line. Lock range may be reduced relative to digital delay lines, in part due to the biasing scheme used in analog delay lines. Embodiments of adaptive biasing are further described below which may advantageously generate a bias voltage and/or current for an analog delay line based on the as-made process characteristics of the analog delay line and/or the frequency of operation of the analog delay line. By adaptively generating a bias voltage and/or current, lock range of a DLL incorporating an analog delay line may be improved.

Figure 5:
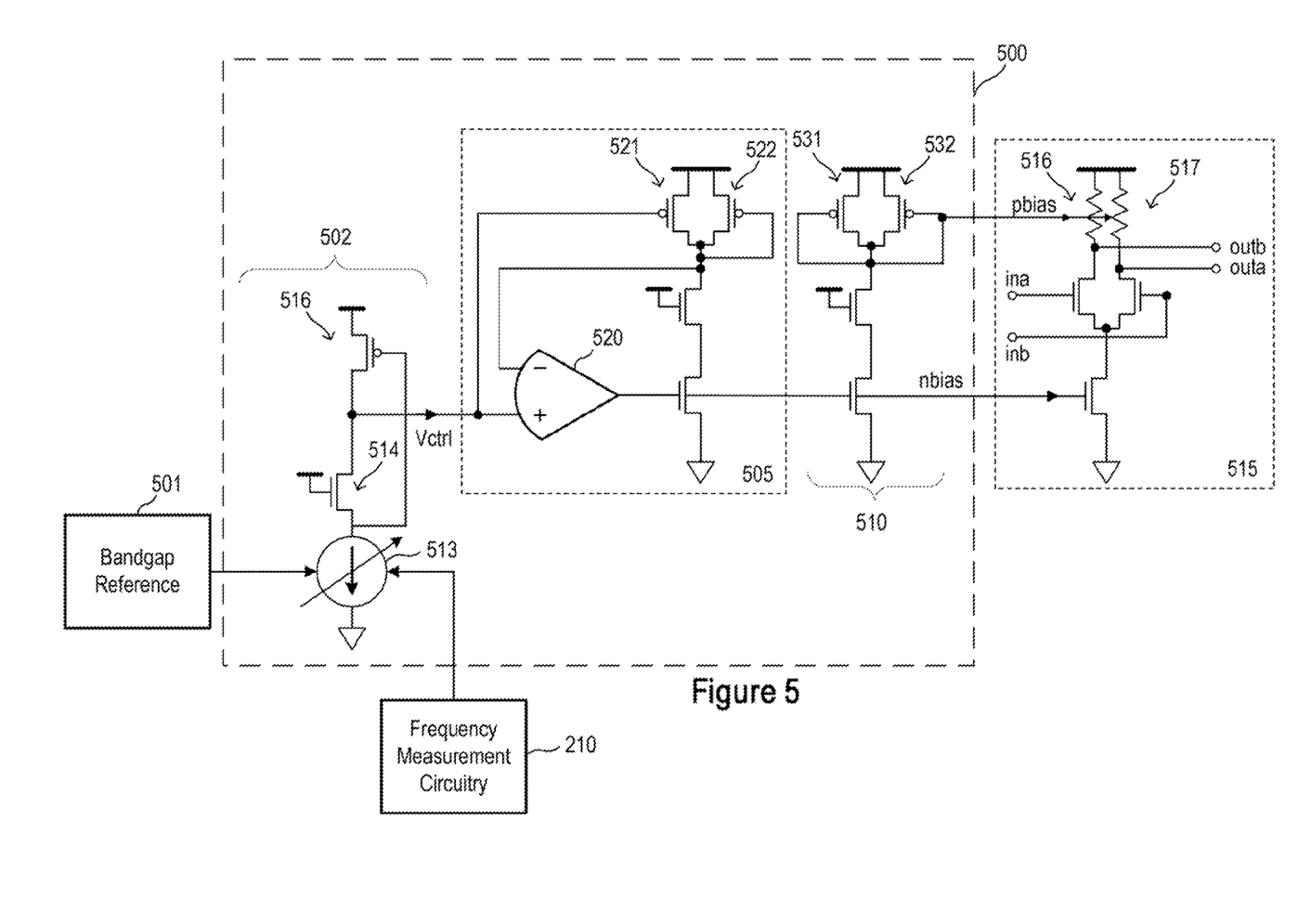
FIG. 5 is a schematic illustration of bias control circuitry arranged in accordance with an embodiment of the present invention.

FIG. 5 is a schematic illustration of bias control circuitry arranged in accordance with an embodiment of the present invention. The bias control circuitry 500 includes a control voltage generator 502 coupled to a half-replica bias circuit 505 coupled to a buffer element 510 which may output the tibias and pbias signals to a delay element 515. The delay element 515 is illustrated in FIG. 5 as a simplified delay element. One or more of the delay elements 301-308 of FIG. 3 may receive the nbias and pbias signals as described above. The loads of the delay element 515 are shown as variable resistors 516 and 517. However, as described with reference to FIGS. 3 and 4, transistors may also be used.

The bias control circuitry 500 is configured to generate the nbias and pbias signals based on a control voltage. The bias control circuitry 500 includes a control voltage generator 502. The control voltage generator is configured to generate a control voltage $V_{ctrl}$. The control voltage is generated by drawing a current from an adjustable current source 513 through transistors 514 and 516. The amount of current 513 may be adjustable and may be based on a comparison with a bandgap reference 501 and a frequency of operation of the analog delay line, which may be provided by the frequency measurement circuitry 210, as has been mentioned above and will be described further below. The adjustable current source 513 may be implemented using one or more current mirrors. The adjustable current source 513 may receive a reference signal from the bandgap reference 501 and a signal indicative of a frequency of operation from the frequency measurement circuitry 210. The adjustable current source 513 may provide a current based on the bandgap reference and the frequency of operation. In this manner, as the frequency of operation increases, the adjustable current source 513 may be adjusted to lower the control voltage $V_{ctrl}$, and vice versa in some examples. The control voltage is generated at the common drains of the transistors 514 and 516, and will be based on the value of the current provided by the adjustable current source 513 and the supply voltage applied to the transistors 514 and 516. The control voltage $V_{ctrl}$ may then be applied to a half-replica bias circuit 505.

The half-replica bias circuit 505 is configured to generate the nbias signal based on a comparison between the control voltage $V_{ctrl}$ and a feedback voltage. The half-replica bias circuit 505 includes an op-amp 520 configured to receive the control voltage and a feedback voltage from a gate/drain connection of a pmos transistor 522. The transistor 521 is configured to receive $V_{ctrl}$ at its gate terminal. The transistor 522 has its drain tied to the drain of the transistor 521 and the gate of the transistor 522. The gate/drain of the transistor 522 is also taken as the feedback voltage to the op-amp 520. The op-amp generates the nbias signal based on a comparison of the control and feedback voltages. The nbias signal is also applied to the buffer element 510, as shown. The pbias signal is generated at the gate of the pmos transistor 512.

In this manner, the nbias and pbias signals may be generated based on a variable control voltage. Accordingly, the tibias and pbias signals may be adaptively generated (e.g. determined). The bias control circuitry may be used as the bias control circuitry 215 of FIG. 2. Other bias control circuitry may be used in other examples for adaptively generating bias signals for the analog delay line 205 of FIG. 2.

Figure 6:
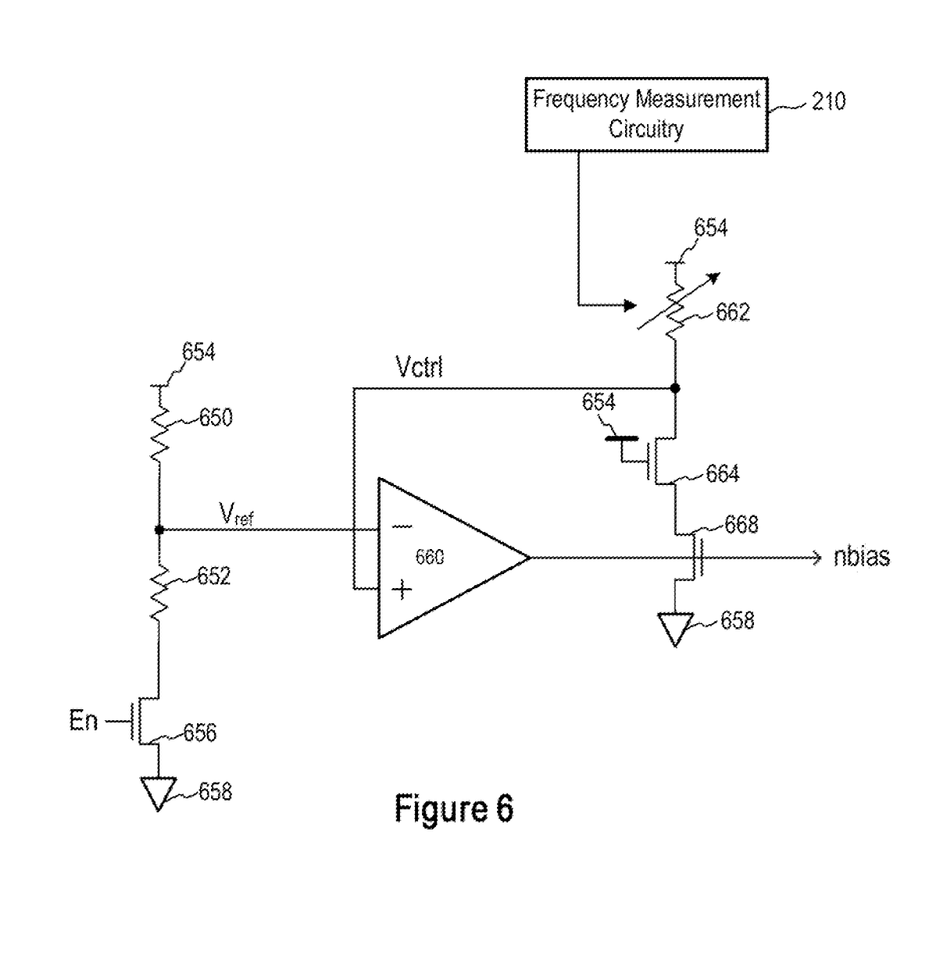
FIG. 6 is a schematic illustration of bias control circuitry arranged in accordance with another embodiment of the present invention.

FIG. 6 is a schematic illustration of bias control circuitry arranged in accordance with another embodiment of the present invention. A reference voltage $V_{ref}$ may be generated by a resistor divider including the series combination of resistors 650 and 652. The reference voltage $V_{ref}$ may be generated at a node between the resistors 650 and 652, and may accordingly be set by the values of the resistors 650, 652, and a voltage applied across the resistors 650 and 652. In the example of FIG. 6, the resistor 650 is coupled between a power supply voltage 654 and $V_{ref}$. The resistor 652 is coupled between and a node of a transistor 656. The transistor 656 is configured to receive an enable signal, En, at its gate. Responsive to the enable signal, the transistor 656 may turn on allowing a current path between $V_{ref}$ and a power supply voltage 658 (ground in FIG. 6). Accordingly, $V_{ref}$ may be generated responsive to the enable signal En.

The voltage $V_{ref}$ may be provided to an input terminal of an operational amplifier 660. The operational amplifier is configured to generate a bias voltage nbias based on the reference voltage $V_{ref}$ and a control signal $V_{ctrl}$ applied to another input terminal of the operational amplifier 660. The control signal $V_{ctrl}$ may be generated based on a value of a variable resistor 662. The value of the variable resistor 662 may be selected based on a signal received from the frequency measurement circuitry 210. For example, the frequency measurement circuitry 210 may provide a signal indicative of a frequency of operation of an analog delay line to the variable resistor 662. The resistance of the variable resistor 662 may be set (e.g. adjusted) based on the signal indicative of the frequency of operation. The variable resistor 662 is coupled between $V_{ctrl}$ and the power supply voltage 654. A transistor 664 may be coupled between $V_{ctrl}$ and a transistor 668. The transistor 664 may have its gate coupled to the power supply voltage 654, causing the transistor 664 to be turned 'on' and conductive. The transistor 664 may be coupled between $V_{ctrl}$ and a transistor 668. The transistor 668 has a gate terminal coupled to an output terminal of the operational amplifier 660 and a terminal coupled to the power supply voltage 658. Accordingly, the transistor 668 may receive the bias voltage nbias at its gate terminal. Responsive to the nbias signal, the transistor 668 may become conductive, and the control voltage $V_{ctrl}$ may accordingly be generated responsive to receipt of the tibias voltage at the gate of the transistor 668.

Generation of an nbias signal is shown in FIG. 6. The circuitry shown in FIG. 6 may also be used to generate the pbias signal. For example, a buffer 510 shown in FIG. 5 may be coupled to the circuitry of FIG. 6 and used to generate the pbias signal.

Accordingly, as shown in FIG. 6, a reference voltage may be generated by a resistor divider. A bias voltage may then be generated using a variable resistor. Although illustrated as a resistor divider and variable resistor in FIG. 6, generally any electronic components having a resistance may be used.

Figure 7:
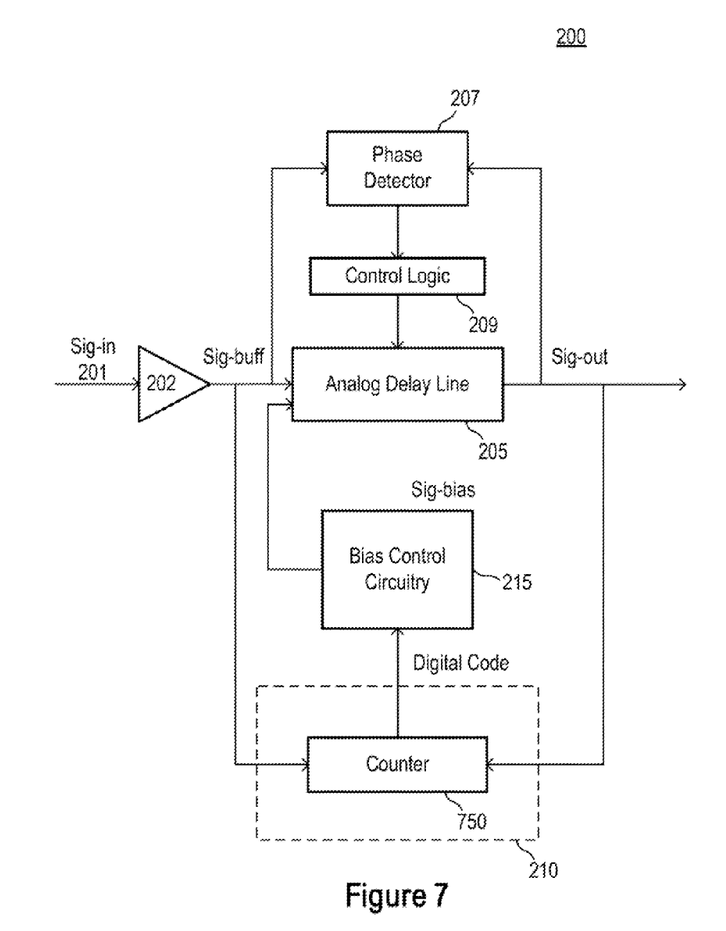
FIG. 7 is a schematic illustration of a DLL including an example implementation of the frequency measurement circuitry according to an embodiment of the present invention.

As described above, the control voltage used to generate the nbias and pbias signals may vary based on a reference and a frequency of operation of the delay line. The frequency of operation may be obtained in a variety of ways. In some embodiments, intrinsic DLL loop delay may be used to obtain the frequency of operation of the DLL. In some DLLs, circuitry may already be provided for measuring the intrinsic DLL loop delay, which is related to the period of the signal being propagated through the DLL. FIG. 7 is a schematic illustration of the DLL 200 of FIG. 2 including an example implementation of the frequency measurement circuitry 210. A counter 750 may count a number of clock cycles for an input signal, such as Sig_buff, to propagate through the analog delay line 205. For example, the counter 750 may begin counting clock cycles responsive to receiving the Sig_buff signal and may stop responsive to receiving a corresponding Sig_out output from the analog delay line 205. The count may be indicative of the period of the signal moving through the path. That is, a lower count may indicate a slower signal period. The counter may output a digital code corresponding to the count, which digital code may be used to adjust the bias signal provided by the bias control circuitry. For example, the digital code may be used to set the current generated by the current source 513 of FIG. 5 or the resistance of the variable resistor 662 of FIG. 6. In some embodiments, the counter 750 may already be provided in the DLL 200 to control other aspects of DLL 200 operation. Accordingly, an existing DLL counter may be used and an additional counter may not be necessary to implement embodiments of the present invention.

Figure 8:
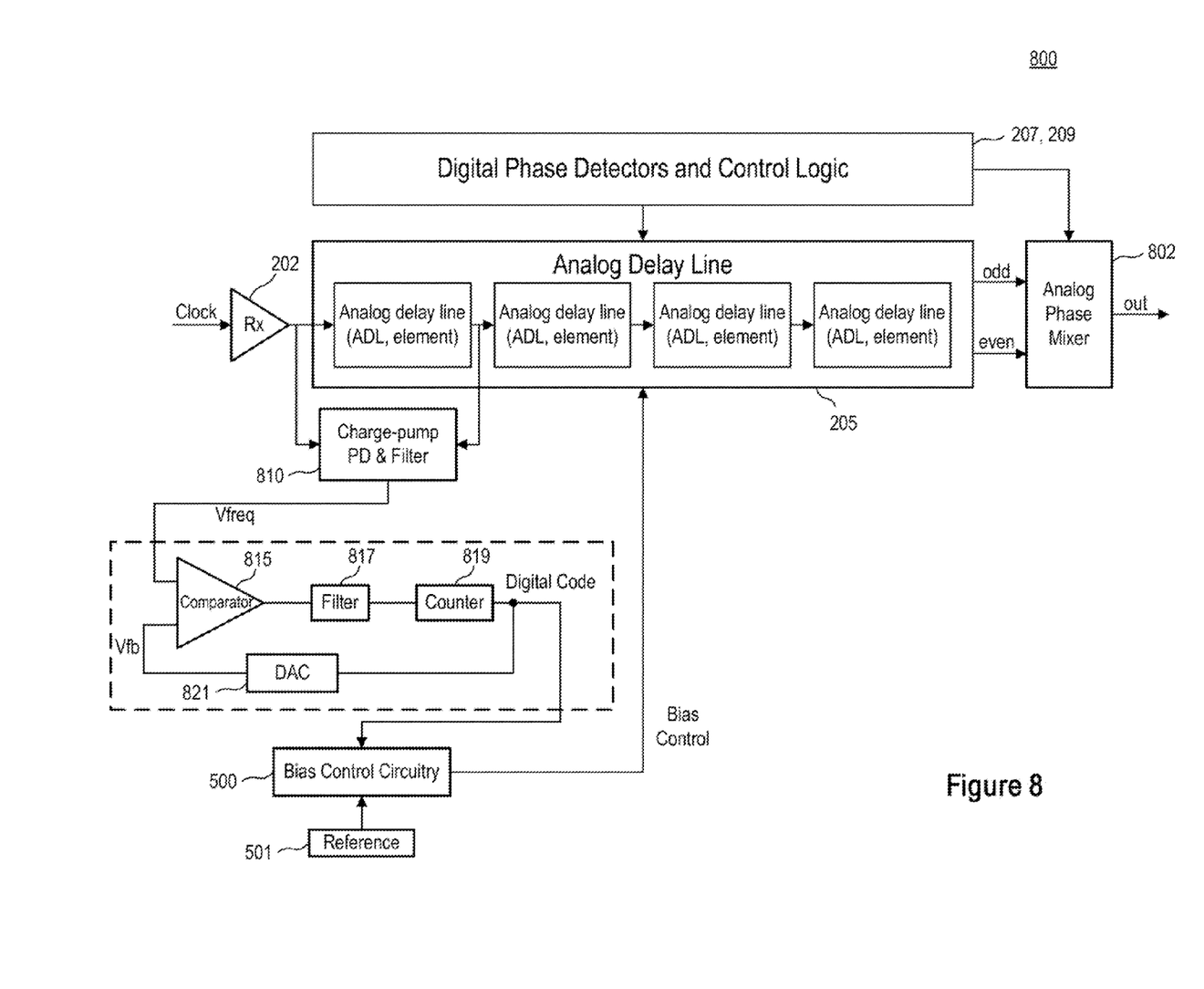
FIG. 8 is a schematic illustration of a DLL incorporating an analog delay line according to an embodiment of the present invention.

The frequency measurement circuitry 210 may have other implementations. For example, a half-cycle analog DLL may be used to lock a half-clock period. This may require a charge pump and phase detector be added to the DLL of FIG. 2. FIG. 8 is a schematic illustration of a DLL incorporating an analog delay line according to an embodiment of the present invention. The DLL 800 includes the analog delay line 205 and buffer 202, as described above. The DLL 800 may further include a phase mixer 802 coupled to the analog delay line 205 for mixing the even and odd output signals to generate a final output signal. As has been described above, digital phase detectors and control logic 207, 201 may be provided to adjust the delay provided by the analog delay hue 205 to synchronize the input and output signals.

The DLL 800 includes a charge pump phase detector and filter 810 configured to generate a signal, $V_{freq}$, indicative of the frequency of operation of the analog delay line. For example, the charge pump phase detector and filter 810 may be configured to lock a half-clock period. The charge pump phase detector and filter 810 is configured to receive the buffered input signal from the buffer 202 and an intermediate signal output from one of the analog delay elements in the analog delay line 205. As shown in FIG. 8, the analog delay line 205 might include thirty-two delay elements. The particular illustrated charge-pump phase detector and filter is configured to receive an output of the eighth delay element and the buffered input signal. The charge-pump phase detector and filter ma then generate a signal indicative of frequency $V_{freq}$ based on a comparison of the phases of the buffered input signal and the output of the eighth delay element of the analog delay line 205. The output of substantially any other element may also be used to generate the control voltage. Accordingly, the signal may be indicative of the period of the clock signal, and accordingly the frequency of operation of the analog delay line. The $V_{freq}$ signal may be provided to a comparator 815 and compared with a feedback signal $V_{fb}$. The output signal indicative of the comparison may be provided to a filter 817 and counter 819. The counter 819 may be configured to generate a digital code indicative of the frequency of operation of the analog delay line 205. The digital code may be provided to a DAC 821 configured to generate the feedback signal $V_{fb}$ for comparison with the $V_{freq}$ signal. The DAC may be implemented using, for example, adjustable current mirrors or resistor dividers. The digital code may be provided to the bias control circuitry 500 and may be used to generate the bias control signal. For example, the digital code may be used to set the current generated by the current source 513 of FIG. 5 or the resistance of the variable resistor 662 of FIG. 6.

Figure 9:
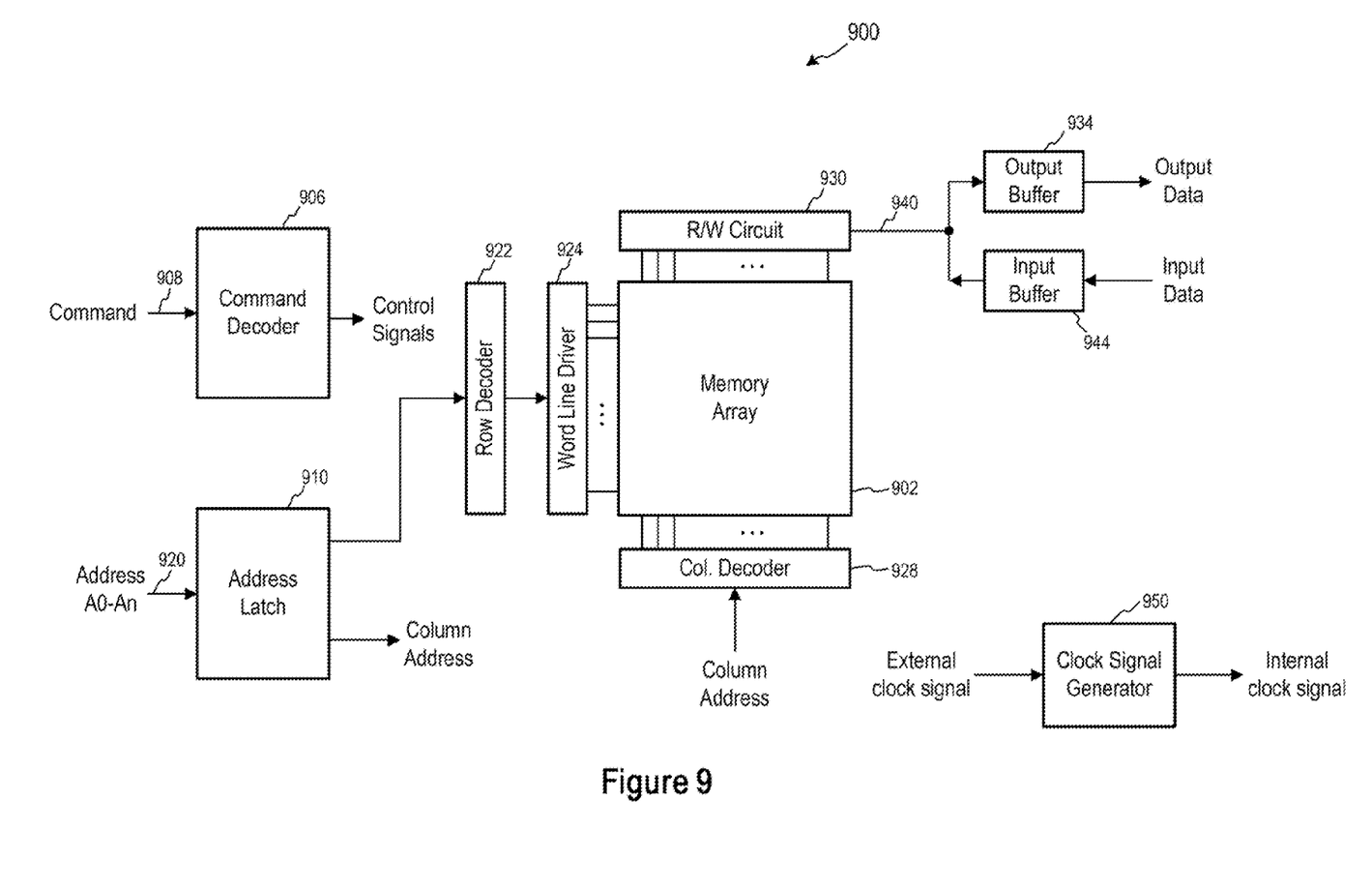
FIG. 9 is a schematic illustration of a portion of a memory according to an embodiment of the present invention.

FIG. 9 is a schematic illustration of a portion of a memory 900 according to an embodiment of the present invention. The memory 900 includes an array 902 of memory cells, which may be, for example, DRAM memory cells, SRAM memory cells, flash memory cells or some other type of memory cells. The memory system 900 includes a command decoder 906 that receives memory commands through a command bus 908 and generates corresponding control signals within the memory system 900 to carry out various memory operations. The command decoder 906 responds to memory commands applied to the command bus 908 to perform various operations on the memory array 902. For example, the command decoder 906 is used to generate internal control signals to read data from and write data to the memory array 902. Row and column address signals are applied to the memory system 900 through an address bus 920 and provided to an address latch 910. The address latch then outputs a separate column address and a separate row address.

The row and column addresses are provided by the address latch 910 to a row address decoder 922 and a column address decoder 928, respectively. The column address decoder 928 selects bit lines extending through the array 902 corresponding to respective column addresses. The row address decoder 922 is connected to word line driver 924 that activates respective rows of memory cells in the array 902 corresponding to received row addresses. The selected data line (e.g., a bit line or bit lines) corresponding to a received column address are coupled to a read/write circuitry 930 to provide read data to a data output buffer 934 via an input-output data bus 940. Write data are applied to the memory array 802 through a data input buffer 944 and the memory array read write circuitry 930.

A clock signal generator 950 is configured to receive an external dock signal and generate a synchronized internal clock signal in accordance with embodiments of the present invention. The clock signal generator 950 may include, for example, the DLL 200 if FIG. 2. The clock signal generator 950 may receive an external clock signal applied to the memory system 900 and may generate a synchronized internal clock signal which may be supplied to the command decoder 906, address latch 910, and/or input buffer 944 to facilitate the latching of command, address, and data signals in accordance with the external clock.

Memory systems in accordance with embodiments of the present invention may be used in any of a variety of electronic devices including, but not limited to, computing systems, electronic storage systems, cameras, phones, wireless devices, displays, chip sets, set top boxes, or gaming systems.

From the foregoing it will be appreciated that, although specific embodiments of the invention have been described herein for purposes of illustration, various modifications may be made without deviating from the spirit and scope of the invention.

What is claimed is:

1. An apparatus, comprising:
   a delay line including a plurality of configurable delay elements, the delay line configured to receive a periodic input signal and provide a periodic output signal and further configured to adaptively configure the delay of a configurable delay element of the plurality of configurable delay elements based on a control signal by adjusting a bias voltage provided to the delay element of the plurality of configurable delay elements; and
   a counter configured to provide the control signal based on a number of periods elapsed between an input and an output of the delay line.

2. The apparatus of claim 1, further comprising a bias control circuit configured to receive the control signal and further configured to provide the bias voltage based, at least in part, on the control signal.

3. The apparatus of claim 2, wherein the bias control circuit comprises:
   a voltage generator circuit configured to provide a control voltage based on a reference voltage and the control signal; and
   a bias generator circuit coupled to the voltage generator circuit and configured to provide the bias voltage based at least in part on the control voltage.

4. The apparatus of claim 1, wherein the bias voltage comprises a nbias voltage and a pbias voltage, wherein the nbias and pbias voltages adjust the delay of the plurality of configurable delays by affecting drive currents of bias circuits and loads, respectively.

5. The apparatus of claim 1, wherein each configurable delay element of the plurality of configurable delay elements comprise:
   a configurable delay amplifier configured to adjust a delay based on the bias voltage; and
   a multiplexer coupled to the configurable delay amplifier and configured to provide a delayed output of the configurable delay element based at least in part on a enable signal and the bias voltage.

6. The apparatus of claim 1, wherein each of the configurable delay elements of the plurality of configurable delay elements is configured to receive an even periodic input and an odd periodic input and to delay both the even and odd periodic inputs, and is further configured to provide an even and odd periodic delayed outputs based at least in part on an enable signal.

7. The apparatus of claim 6, further comprising a phase mixer coupled to each of the configurable delay elements of the plurality of configurable delay elements and configured to receive the even and odd periodic delayed outputs and further to provide the periodic output signal based at least in part on the even and odd periodic delayed outputs from the plurality of configurable delay elements.

8. An apparatus, comprising:
   a delay line including a plurality of delay elements, the delay line configured to receive a signal and provide a delayed output signal, wherein a delay element of the delay elements are configured to delay the signal based at least in part on a bias voltage;
   a bias voltage circuit coupled to the delay line and configured to provide the bias voltage based at least in part on a control signal; and
   a counter coupled to the delay line and the bias voltage circuit and configured to provide the control signal based at least in part on a number of periods elapsed between the signal and a delayed signal of the counter.

9. The apparatus of claim 8, wherein the delayed signal of the counter is an intermediate delayed signal provided by the delay line.

10. The apparatus of claim 8, wherein the bias voltage decreases when the number of periods between the signal and the delayed signal of the counter increases.

11. The apparatus of claim 8, wherein the bias voltage circuit is configured to provide the bias voltage based in part on a comparison of a bandgap reference and the control signal.

12. The apparatus of claim 8, wherein the delay line comprises a bias circuit, and wherein the bias circuit is configured to provide a bias current to more than one of the plurality of delay elements based at least in part on the bias voltage.

13. The apparatus of claim 8, further comprising:
   a charge pump phase detector configured to provide a signal indicative of a phase difference between a periodic input signal and a periodic output signal; and
   a comparator configured to compare the signal provided by the charge pump phase detector with a feedback signal and provide an output signal indicative of the comparison to a filter and the counter, wherein the counter is configured to provide the control signal based at least in part on the output signal indicative of the comparison.

14. The apparatus of claim 8, further comprising:
   digital control logic configured to provide a digital control signal and wherein a delay element of the plurality of delay elements is configured to receive the digital control signal and wherein the amount of delay provided by the delay element of the plurality of delay elements is also based at least in part on the digital control signal.

15. The apparatus of claim 8, wherein each of the plurality of delay elements comprises a multiplexer configured to select an output of a delay amplifier as an output of the delay line in accordance with a multiplexer control signal.

16. A method, comprising:
   receiving a periodic input signal at a delay line;
   providing a periodic output signal by the delay line; and
   configuring a delay of the delay line based at least in part on a number of periods elapsed between an input and an output of the delay line.

17. The method of claim 16, wherein configuring a delay of the delay line based at least in part on a number of periods elapsed between an input and an output of the delay line comprises:
   providing a control signal to a bias circuit based at least in part on the number of periods elapsed between the input and the output of the delay line; and
   providing, by the bias circuit, a bias voltage to the delay line based at least in part on the control signal; and
   adjusting the delay of the delay line based at least in part on the bias voltage.

18. The method of claim 16, wherein configuring a delay of the delay line based at least in part on a number of periods elapsed between an input and an output of the delay line comprises:
   adjusting the delay of the delay line based at least in part on a digital code; and comparing the phase of the periodic input signal and the periodic output signal by control logic to provide the digital code, wherein the digital code is indicative of a phase difference between the periodic input signal and the periodic output signal.

19. The method of claim 16, wherein the number of periods elapsed between the input and the output of the delay line is indicative of a frequency of operation of the periodic input and output signals.

20. The method of claim 16, the delay line comprises a plurality of analog delay elements coupled in series, individual ones of the analog delay elements include an analog amplifier and a multiplexer, and wherein configuring a delay of the delay line based at least in part on a number of periods elapsed between an input and an output of the delay line comprises adjusting a delay of a delay element of the plurality of analog delay elements.

\* \* \* \* \*